United States Patent [19]

Lipson et al.

[11] Patent Number: 4,943,513

[45] Date of Patent: Jul. 24, 1990

[54] PHOTOIMAGEABLE COMPOSITION WITH REDUCED COLD FLOW DUE TO SALT-BRIDGING BY METAL IONS AND DRY FILM FORMED THEREFROM

[75] Inventors: Melvin A. Lipson, Newport Beach; Thomas P. Carter, Laguna Beach; James G. Shelnut, Lake Forest; Leo Roos, Laguna Beach, all of Calif.

[73] Assignee: Morton Thiokol, Inc., Chicago, Ill.

[21] Appl. No.: 255,579

[22] Filed: Oct. 7, 1988

[51] Int. Cl.$^5$ .......................... G03C 1/90; G03C 1/68
[52] U.S. Cl. .................................. 430/260; 430/270; 430/271; 430/281; 430/954
[58] Field of Search ............... 430/954, 270, 281, 271, 430/327, 260; 522/29, 66

[56] References Cited

U.S. PATENT DOCUMENTS

| | | | |
|---|---|---|---|
| 3,016,297 | 1/1962 | Mochel | 430/281 |
| 4,284,744 | 8/1981 | Shaffer | 525/389 |
| 4,332,879 | 6/1982 | Pastor et al. | 430/272 |
| 4,513,076 | 4/1985 | Lewis | 430/270 |
| 4,536,468 | 8/1985 | Yasui et al. | 430/296 |
| 4,693,957 | 9/1987 | Archer et al. | 430/269 |

*Primary Examiner*—Paul R. Michl
*Assistant Examiner*—Christopher D. RoDee
*Attorney, Agent, or Firm*—Wayne E. Nacker; Gerald K. White

[57] ABSTRACT

A photoimageable composition of the negative acting type which includes a binder polymer which contains carboxyl groups is provided with a metal chelate in which the coordination number of the metal is 2 or higher. When the photoimageable composition is coated as a layer on a dry film, the metal chelate reacts with the carboxyl groups of the polymer, releasing a metal ion which bridges carboxyl groups of two or more polymer molecules. This bridging reduces cold flow of the photoimageable composition layer of the dry film.

13 Claims, No Drawings

PHOTOIMAGEABLE COMPOSITION WITH REDUCED COLD FLOW DUE TO SALT-BRIDGING BY METAL IONS AND DRY FILM FORMED THEREFROM

The present invention is directed to photoimageable compositions, such as are used for manufacture of printed circuit boards and for forming solder masks which cover printed circuit boards. In particular, the present invention is directed to photoimageable compositions useful as the photoimageable layer in dry films.

BACKGROUND OF THE INVENTION

Photoimageable compositions are used for various purposes in the manufacture of printed circuit boards of the like. Photoimageable compositions in the form of a primary imaging photoresist are used in the formation of the printed circuitry itself. In a typical procedure, a panel for forming a printed circuit board comprises a thin layer of metal covering a non-conductive substrate. A layer of photoresist is applied over the metal layer. The photoresist is exposed to patterned actinic radiation, e.g., by passing illumination through artwork having an opaque/transparent pattern. The exposed photoresist is then developed by exposure to a solution or solvent which, depending upon the type of photoresist, washes away either the exposed or unexposed portion of the photoresist, leaving a patterned layer of either unexposed or exposed photoresist. The panel can then be etched with a solution which removes the metal layer from those portions of the plate from which photoresist has been removed. Subsequent to etching, the remaining photoresist layer is generally stripped away. Alternatively the panel can be pattern plated, whereby the areas devoid of photoresist are electrolessly or electro-chemically plated with copper or the like, the resist is stripped, as above-mentioned, and the newly exposed areas are then removed by etching, leaving behind the pattern plated areas.

Other photoimageable compositions are used for forming solder masks in a similar manner. These compositions are used to form a hard, permanent layer which overlies printed circuitry except in those portions of the printed circuitry to which solder is to be applied.

Photoimageable compositions may be applied to a panel in liquid form and then either allowed to dry or to partially cure so as to form a semi-stable layer. Alternatively, the photoimageable composition may be used to form a dry film comprising a layer of photoimageable composition on a cover sheet of support material. The layer of photoimageable material is subsequently transferred from the support sheet to a surface of the plate.

There are a number of advantages to applying a photoimageable layer to a circuit board from a dry film rather than as a liquid. In particular, dry films are free of organic solvent and therefore eliminate solvent hazards from the workplace and eliminate the need for apparatus to protect the immediate work environment and the more general environment from organic solvent emissions.

Dry films comprise the layer of photoimageable material and the cover sheet of support material. The support material is somewhat flexible but has sufficient rigidity to provide structure to the layer of photoimageable material. Typically the cover sheet is formed of a polyester, such as polyethylene terephthalate (PET), such as that sold as MELINEX ®. As the photoimageable layer is to be transferred from the cover sheet, a release agent may be applied to the surface of the cover sheet which carries the photoresist layer. It is typical to also provide a protective sheet, e.g., a sheet of polyethylene, on the surface of the photoimageable layer opposite the cover sheet. The protective sheet, in addition to protecting the photoimageable layer, better enables the dry film to be rolled into a reel. The protective sheet is removed from the photoresist layer prior to application of the dry film to the circuit board U.S. Pat. No. 4,530,896 and U.S patent application Ser. No. 07/210,194 filed June 20, 1988 the teachings of each being incorporated herein by reference, describe dry films in which a top coat is interposed between the cover sheet and photoimageable layer, which top coat is selectively adherent to the photoimageable layer (relative to its adherence to the cover sheet). The top coat serves to protect the photoimageable layer from mechanical damage and from oxygen after removal of the cover sheet prior to exposure to patterned actinic radiation. Other examples of dry films can be found in U.S. Pat. Nos. 3,887,450, 4,539,286 and 4,610,951, the teachings of each being incorporated herein by reference.

The present invention is generally directed to photoimageable compositions and dry films formed therefrom which are used in the manufacture of printed circuit boards, including those in which the photoimageable composition is a primary imaging photoresist and those in which the photoimageable composition is a solder mask-forming composition. The invention is applicable to dry films in which the photoimageable layer is in direct contact with the cover sheet (in which case the photoimageable layer is generally exposed through the cover sheet) and those in which a top coat is interposed between the photoimageable layer and the cover sheet (in which case the cover sheet is generally removed prior to exposure of the photoimageable layer). In addition to use in the manufacture of printed circuit boards, dry films having photoresist layers are used in chemical milling, lithographic printing gravure printing and the like, and the invention is applicable to photoimageable compositions and dry films formed therefrom regardless of the application of the dry film.

As explained above, the photoimageable layer of a dry film is sandwiched on a supportive cover sheet and usually between the cover sheet and a protective sheet. The manufacture of the dry film includes the winding of the multi-layered material around a carrier core. This creates internal tensions and pressures, whereby the highly viscous, semi-solid photoimageable composition can be forced to relieve those pressures by oozing out along the sides of the coil, a phenomena known as cold flow. Cold flow causes serious problems, such as edge fusion and chipping of the photoimageable layer during unwinding. Furthermore, cold flow contributes to internal non-uniformity of the thickness of the photoimageable layer.

Various methods have been devised to control cold flow. These include flash photolysis to harden the ends of the coil and thereby produce a damming effect, application of an adhesive end-capping device to stem the flow, use of embossed cover sheets to physically relieve the internal pressures, and use of amphoteric interpolymers in the photoimageable compositions to reduce the fluidity of the photoimageable compositions.

The present invention is specifically directed to photoimageable compositions used to form dry films; the photoimageable compositions containing a chemical which acts to reduce cold flow of the photoimageable layer.

SUMMARY OF THE INVENTION

To a photoimageable composition of the type comprising a binder polymer having free carboxyl groups, a monomer which acts upon photoinitiation to harden the composition and a photoinitiator, there is added a metal chelate of an organic compound, the metal chelate having a chelated metal atom of a coordination number of 2 or higher. The metal chelate is selected to have chelating groups sufficiently basic enough that they react with the carboxyl groups of the polymer in an acid/base reaction to release the chelated metal atom as a metal ion to the carboxyl groups. Metal ions then form a salt with and thereby bridge carboxyl groups of two or more polymer molecules create a cross-linked structure which hardens the photoimageable composition somewhat but nevertheless leaves the photoimageable composition developable in basic aqueous and semi-aqueous developer solutions. When the photoimageable composition is applied as a photoimageable layer on a dry film, the additional hardness, afforded by cross-linking of the carboxyl groups through the metal ions, very substantially reduces cold flow. Other properties of the photoimageable composition layer are not significantly affected.

DETAILED DESCRIPTION OF CERTAIN PREFERRED EMBODIMENTS

The photoimageable compositions to which the present invention pertains are those of the negative-acting type which contain a binder polymer having free carboxyl groups and which are therefore developable in basic aqueous or semi-aqueous solutions. Examples of such polymers are found, in the following U.S. Pat. Nos.: 4,615,950; 3,359,129; 3,526,504; 3,980,483; 4,025,407; 4,210,449; 4,260,675; 4,268,614; 4,289,845; 4,413,052; 4,451,523; 4,465,760; 4,528,261; 4,296,196; 4,361,640; 4,250,248; 3,953,309; 3,376,138; and 4,239,849. In addition to the binder polymer, a photoimageable composition to which the invention is applicable includes a monomer or monomers which upon photoinitiation react with and cross-link the polymer, usually by a free-radical reaction. The composition also includes a photoinitiator which is sensitive to light and which upon exposure to light generates a species, e.g., a free radical, that initiates the cross-linking reaction. The cross-linking reaction renders those portions of the photoimageable composition exposed to light insoluble in aqueous or semi-aqueous developers, while the unexposed portions of the photoimageable compositions are soluble in basic aqueous or semi-aqueous developer solutions. (By semi-aqueous solution is meant herein a solution which is about 90% or more by volume aqueous solution, balance an organic solvent such as alcohols, ethers, glycols, esters, ketones, glycol ethers and the like.)

Because the invention is applicable to a wide variety of photoimageable compositions, the relative percentages of the binder polymer, the monomer(s) and photoinitiator may vary over a wide range. The carboxyl-containing binder polymer may comprise between about 30 and about 80 wt. percent of the solids of the composition, the monomer(s) may comprise between about 15 and about 65 wt. percent of the solids of the composition and the photoinitiator may comprise between about 0.005 and about 5 wt. percent of the solids of the composition. Additionally, the photoimageable compositions may contain a wide variety of additional components as are known in the art, including additional polymers such as those which might be used to effect a final hardened cure of a solder mask, dyes, stabilizers, flexibilizing agents, fillers etc.

In accordance with the improvement of the present invention, photoimageable compositions which are to be used in dry films and which have binder polymers with free carboxyl groups, are provided a metal chelate which acts to reduce cold flow of the photoimageable composition which is applied as a layer of the dry film. The metal chelate comprises between about 0.005 and about 2.0 percent by weight relative to the solids of the photoimageable composition and preferably between about 0.2 and about 0.5 wt. percent. The metal of the metal chelate comprises between about 0.0004 and about 2 wt. percent relative to the solids of the photoimageable composition. The metal chelate is sufficiently basic to react with the free carboxyl groups of the polymer so as to release the chelated metal atom as a metal ion to the carboxyl groups. The metal atom of the chelate has a coordination number of 2 or higher, releasing a metal ion of 2+ charge or higher, allowing the metal ion to form a salt with and thereby cross-link carboxyl groups of two or more polymer molecules.

With regard to the metal of the metal chelate, substantially any metal which forms a chelate of coordination number 2 or higher is suitable for the practice of the present invention, although some metals are more preferred than others. Preferred metal species are titanium, copper, aluminum, zinc and zirconium. Health considerations may be taken into account when selecting a metal species, for example, although chromium would work in the practice of the invention, health considerations may counterindicate its use. Other suitable metals for the metal component of the metal chelate include but are not limited to cobalt (II and III). copper (II), iron (III), manganese (II), magnesium (II), nickel (II), tin (II), titanium (IV), and vanadium (III).

A preferred type of organic moiety for the metal chelate is the β-diketone variety of the general formula

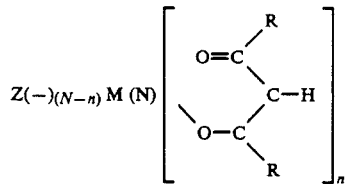

where M is the metal having coordination number N, N being at least 2, n is the number of β-diketone moieties chelated with the metal, n being at least 2, R is alkyl, aryl, aralkyl (substituted or unsubstituted), and the like, Z is one or more organic or inorganic moieties directly linked to the metal by (N-n) bonds. Preferably R is CH$_3$; that is, the chelate is a metal acetylacetonate (or metal pentanedionates). Typically N=n as in aluminum-III acetylacetonate, chrominum-III acetylacetonate, cobalt-II acetylacetonate, coabalt-III acetylacetonate, copper-II acetylacetonate iron-III acetylacetomate, magnesium-II aoetylacetonate, manganese-II acetylacetonate, nickel-II acetylacetonate, tin-II acetylacetonate, vanadium-III acetylacetonate, zinc-II acetylacetonate and zirconium-IV acetylacetonate. Examples of acetylacetonates where N>n and therefore have a Z moiety(s) include titanium-IV di-isoproproxy-bis(acetylacetonate) and vanadium oxy-bis-(acetylacetonate).

Another type of metal chelate is of the ferrocene type wherein a metal is chelated to two or more modified or unmodified cyclopentadiene rings. A wide variety of these compounds are listed in the review article "Synthesis of Cyclopentadienyl Metal Compounds" by John M. Birmingham, pp 365-413.

Other suitable ligands include β-ketoimines, β-ketoesters, malonates, alcoholates, thiolates, phosphonates, phosphinates, phosphorates, phosphates, sulfates, sulfonates, sulfinates, sulfenates, silicates and the like. A wide variety of other ligands are known in the art which would be expected to be suitable for purpose of the present invention.

In general any organometallic compound can be beneficially utilized with the following restraints. The organic portion of the organometallic, here described as the chelating group, in its protonated form, must have a pKa value approximately 1 unit higher than the carboxylic acid group, and the metal of the organometallic must be in a valence (coordination) state of at least two and can be higher. Examples of pKa's are given below:

| COMPOUND | pKa (RELATIVE TO WATER) |
|---|---|
| RCOOH | 4-5 |
| ACETYLACETONATE | 9 |
| ArOH (PHENOLICS) | 8-11 |
| β-KETOESTERS | 11 |
| DIETHYL MALONATES | 13 |
| CYCLOPENTADIENE | 16 |
| ROH (ALCOHOLS) | 18-19 |
| RSH (THIOLS) | 10-11 |

From this Table it can be seen that the general formula for the appropriate materials are:

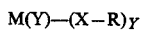

where
M = A metalic Compound
X = C, O, N, S, P, Si, etc. and mixtures thereof
R = Alkyl, aryl, aralkyl (substituted or unsubstituted)
Y = The coordination number of M, which is 2 or more.

The reaction with carboxyl-containing polymers, is an acid/base type reaction with the carboxyl group donating a hydrogen ion to the ligand and the metal chelate releasing the metal as an ionic species with a valence equal to its coordination number with the ligand to which it had been attached. Thus, for example, aluminum-III acetylacetonate releases $Al^{+++}$ ions; titanium-IV di-isopropoxy-bis(aoetylacetonate) releases $Ti^{++++}$ ions. The released metal ions charge-bind, i.e., form salts, with carboxyl ions. Those metal ions which charge-bind with carboxyl ions of different polymer molecules form a cross-linked structure which creates a hardening effect that is effective in reducing cold flow of the photoimageable composition.

Of course, not all of the released metal ions will necessarily bridge polymers. Some of the metal ions will internally bridge carboxyl groups within a polymer molecule or bind to other negative ions in the photoimageable compositions. For this reason, the amount of metal chelate needed to control cold flow in a photoimageable composition is empirically determined for each particular photoimageable composition.

An important aspect of the present invention is that although the metal chelate reacts with the carboxyl groups of the polymer molecules to produce a hardening effect that limits cold flow, the metal chelate does not significantly affect the viscosity of the photoimageable composition prior to its application the cover sheet. For application to the cover sheet, the solids of the photoimageable composition are admixed with a significant volume of a suitable solvent, and it may be that significant bridging of polymers does not occur when the photoimageable composition is so diluted. Alternatively, it may be that the bridging reaction is sufficiently slow under coating conditions, that hardening does not occur to an appreciable extent in a freshly prepared, diluted photoimageable composition until after the photoimageable composition is coated onto the support sheet. Generally, the photoimageable composition is admixed with a suitable solvent, an equal volume of solvent being typical, although the volume ratio of photoimageable composition solids to solvent may vary over a wide range, i.e., from about 2:1 to about 1:5. Typical solvents are ketones, alcohols, glycols, and the like or comixtures thereof.

The solids of the photoimageable composition and the metal chelate are admixed with the solvent, and the solution is coated onto the cover sheet in a conventional manner. The layer of photoimageable composition is then dried to remove solvent. Conventionally, this drying is effected at somewhat elevated temperatures, e.g., 50° C. It is believed that this elevated temperature hastens the reaction of the metal chelates and the carboxyl groups, although such reactions also occur in room temperature drying protocols. After drying, a protective sheet is applied and the dry film is rolled onto a reel in a conventional manner. The hardening which has taken place acts to prevent cold flow of the photoimageable composition during reeling and in subsequent rereelings.

Inherent in the process of the present invention is that substantial hardening cannot occur before the photoimageable composition (in solvent) is coated onto the cover sheet, and any metal chelate which prematurely gels the solution cannot be used. It is also inherent that the metal chelate be soluble in whatever solvent is used for applying the photoimageable composition to the cover sheet. The metal chelate must furthermore react with the carboxyl groups of the polymer molecule sufficiently rapidly that a sufficient amount of hardening occurs during the normal drying period so that cold flow during reeling of the dry film is inhibited.

Although the photoimageable layer which is cross-linked through the metal ions is harder than corresponding photoimageable layers without such cross-linking, the photoimageable layer is nevertheless sufficiently flexible to be rolled and unrolled from a reel. Furthermore, the photoimageable layers retain their adhesion to the applicable substrates.

The hardening effect of the metal ions does not appear to significantly affect the photosensitive properties of the photoimageable compositions. The photoinitiated cross-linking reaction of the monomers with the polymer molecules takes place in the normal fashion. In some cases the development time is lengthened slightly as the developing solution (which is usually slightly alkaline) must break the bridging bonds of the unexposed portions of the photoimageable composition. On the other hand, in the case of a photoresist, stripping time appears to be decreased in most cases. Thus, the photoimageable compositions modified in accordance with the present invention may be used to form dry films that can be processed with only minor modifications in the standard plating/exposure/development/etching/stripping protocol.

The invention will now be described in greater detail by way of specific examples.

EXAMPLE 1

(Prior Art)

A composition containing the following:

| (A) | Copolymer of styrene/methylmethacrylate/acrylic acid/n-butylmethacrylate (14:37:33:16) | 40 |
|---|---|---|
| (B) | Ethoxylated trimethylolpropane triacrylate | 24 |
| (C) | 1H-Benzotriazole | 0.02 |
| (D) | Benzophenone | 2 |
| (E) | Michler's Ketone | 0.01 |
| (F) | Victoria Pure Blue | 0.04 |
| (G) | Tricresyl Phosphite | 0.10 |
| (H) | Methyl Ethyl Ketone | 70 | was coated onto a polyester web by a meniscus coating method and wound around 6 inch core material in 400 foot lengths and 20 inch widths. The roll was allowed to stand upright in a 35° C. oven for a period of 5 days. When the roll was removed and inspected the following conditions were found: telescoping, cold flow, edge fusion, coating irregularities and various alterations in coating thicknesses throughout the roll.

EXAMPLE 2

A composition as described in Example 1 above but with the addition of 0.02 parts of aluminum acetylacetonate. When this was coated as above and oven treated as above, the roll did not exhibit any of the conditions as described above which are related to cold flow characteristics.

EXAMPLE 3

(Prior Art)

A composition as described in Example 1 above but the copolymer was in a ratio of 14:46:19;20, having a decrease in the acrylic acid functionality. When coated and oven treated as described above the cold flow conditions were even worse than in composition 1.

EXAMPLE 4

A composition as described in Example 3 but with the addition of 0.02 parts of aluminum acetylacetonate. Again, the cold flow characteristics were eliminated after coating this composition and oven treating it.

EXAMPLES 5 AND 6

Compositions as described in Examples 2 and 4 above but increasing the amount of aluminum acetylacetonate to 0.04 parts. Again, cold flow conditions were eliminated.

EXAMPLES 7 AND 8

Compositions as described in Examples 2 and 4 above but decreasing the amount of aluminum acetylacetonate to 0.01 parts. The cold flow conditions were reduced but not completely eliminated. No attempt was made to completely optimize the amount of aluminumacetylaetonate in the system.

EXAMPLES 9–14

Compositions as described in Examples 2 and 4 above in which copper(II) acetylacetonate and iron(III) acetylacetonate was added in place of aluminum acetylacetonate at 0.01, 0.02 and 0.04 part levels. In these cases cold flow characteristics were eliminated.

While the invention has been described in terms of certain preferred embodiments, modifications obvious to one with ordinary skill in the art may be made without departing from the scope of the present invention.

Various features of the invention are set forth in the following claims.

What is claimed is:

1. A dry film comprising
a cover sheet having sufficient flexibility to be wound as a roll, and
a photoimageable composition layer on said cover sheet which is developable by alkaline aqueous or semiaqueous solutions, the solids of said photoimageable composition comprising between about 30 and about 80 wt. percent or a polymer containing carboxylic acid groups, between about 15 and about 65 wt. percent of a monomer or monomers capable of undergoing a photochemical reaction which cross-links said polymer and between about 0.0004 and about 5 wt. percent of a photoinitiator, the improvement comprising, said photoimageable composition containing metal ions of charge 2+ or higher salt-bridging carboxylic acid groups of different polymer molecules, which salt-bridging reduces cold flow in the photoimageable composition layer.

2. A dry film according to claim 1 wherein the metal ions are present at between about 0.0004 and about 2 wt. percent of said photoimageable compositions.

3. A dry film according to claim 1 wherein said metal ions are residue of metal chelates added to the photoimageable composition from which said layer was formed.

4. A dry film according to claim 3 wherein said metal ions are derived from the metal chelate of a β-diketone.

5. A dry film according to claim 1 wherein a top coat is interposed between said flexible cover sheet and said photoimageable composition, said top coat being selectively adherent to said photoimageable composition layer relative to its adherence to said cover sheet.

6. A dry film according to claim 1 wherein the metal species of said metal chelate is selected from the group consisting of titanium, aluminum, zinc and zirconium.

7. A film-forming photoimageable composition which is developable in akaline aqueous or semiaqueous solution and suitable for forming a dry film having sufficient flexibility to be wound as a roll, the solids of which photoimageable composition comprise between about 30 and about 80 wt. percent of a polymer containing carboxylic acid groups, between about 15 and about 65 wt. percent of a monomer or monomers capable of undergoing a photochemical reaction which cross-links said polymer and between about 0.005 and about 5 wt. percent of a photoinitiator, the improvement comprising said photoimageable composition containing a metal chelate at a weight percent relative to said solids of between about 0.05 and about 2.0, the metal of said metal chelate having a coordination number of 2 or higher, said metal chelate being reactive with the carboxylic acid groups or said polymer to release metal ions of charge 2+ or higher to salt-bridge carboxylic acid groups of two or more polymer molecules.

8. A photoimageable composition according to claim 7 wherein the metal of said metal chelate is selected from the group consisting of titanium, aluminum, zinc and zirconium.

9. A photoimageable composition a according to claim 7 wherein said metal chelate of an organic compound selected from the group consisting of β-ketoimines, β-ketoesters, malonates, alcoholates, thiolates, phosphonates, phosphinates, phosphorates, phosphates, sulfates, sulfonates, sulfinates, sulfenates, silicates and mixtures thereof.

10. A photoimageable composition according to claim 9 wherein said metal chelate is the metal chelate of a β-diketone.

11. A photoimageable composition according to claim 7 also including an organic solvent, the/volume ratio of the solids of said photoimageable composition to said solvent ranging from about 2:1 to about 1:5.

12. A method of forming a dry film comprising
providing a cover sheet of material having sufficient flexibility to be wound as a roll,
providing a photoimageable composition which is developable by alkaline aqueous or semiaqueous solutions, the solids of which photoimageable composition comprise between about 30 and about 80 wt. percent of a polymer containing carboxylic acid groups, between about 14 and about 65 wt. percent of a monomer or monomers capable of undergoing a photochemical reaction which cross-links said polymer and between about 0.005 and about 5 wt. percent of a photoinitiator, a metal chelate at a weight percent relative to said solids of between about 0.05 and about 2.0, the metal of said metal chelate having a coordination number of 2 or higher, said metal chelate being reactive with the carboxylic acid groups of said polymer to release metal ions of charge 2+ or higher to salt-bridge carboxylic acid groups of two or more polymer molecules, and organic solvent, the volume ratio of the solids of said photoimageable composition to said solvent ranging from about 2:1 to about 1:5,
coating said photoimageable composition over said cover sheet, and
drying said coated photoimageable composition to remove solvent and thereby forming a photoimageable composition layer on said cover sheet.

13. A method according to claim 12 including the step of first applying a top coat on said cover sheet and coating said photoimageable composition on said top coat, said top coat being formed of material that is selectively adherent to said photoimageable composition layer relative to its adherance to said cover sheet.

* * * * *

UNITED STATES PATENT AND TRADEMARK OFFICE
CERTIFICATE OF CORRECTION

Page 1 of 2

PATENT NO. : 4,943,513
DATED : July 24, 1990
INVENTOR(S) : Lipson et al.

It is certified that error appears in the above-identified patent and that said Letters Patent is hereby corrected as shown below:

At column 1, line 16, "of" should be --or--.

At column 4, lines 48 and 49,

" 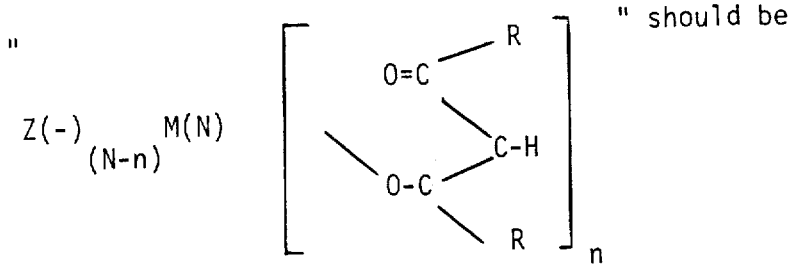 " should be

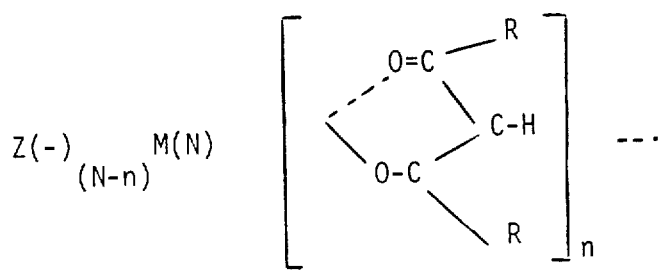 --.

UNITED STATES PATENT AND TRADEMARK OFFICE
CERTIFICATE OF CORRECTION

PATENT NO. : 4,943,513
DATED : July 24, 1990
INVENTOR(S) : Lipson et al.

It is certified that error appears in the above-identified patent and that said Letters Patent is hereby corrected as shown below:

At column 4, line 65, "acetylacetomate" should be --acetylacetonate--.

At column 4, line 66, "aoetylacetonate" should be --acetylacetonate--.

At column 5, line 56, "(aoetylacetonate)" should be --(acetylacetonate)--.

At column 7, line 47, "14:46:19;20" should be --14:46:19:20--.

At column 8, lines 24 and 68, "or" should be --of--.

Signed and Sealed this

Fifth Day of October, 1993

Attest:

BRUCE LEHMAN

Attesting Officer

Commissioner of Patents and Trademarks